US009754781B2

(12) United States Patent
Okuda et al.

(10) Patent No.: US 9,754,781 B2
(45) Date of Patent: Sep. 5, 2017

(54) SEMICONDUCTOR MANUFACTURING METHOD

(71) Applicant: KABUSHIKI KAISHA TOSHIBA, Tokyo (JP)

(72) Inventors: Shinya Okuda, Oita (JP); Kei Watanabe, Mie (JP); Hidekazu Hayashi, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/064,990

(22) Filed: Mar. 9, 2016

(65) Prior Publication Data

US 2016/0276170 A1    Sep. 22, 2016

(30) Foreign Application Priority Data

Mar. 17, 2015   (JP) ................. 2015-053832

(51) Int. Cl.
*H01L 21/311*    (2006.01)
*H01L 21/02*     (2006.01)
*H01L 21/322*    (2006.01)
*H01L 21/3205*   (2006.01)

(52) U.S. Cl.
CPC .... *H01L 21/02274* (2013.01); *H01L 21/0206* (2013.01); *H01L 21/02115* (2013.01); *H01L 21/32055* (2013.01); *H01L 21/31111* (2013.01)

(58) Field of Classification Search
CPC .......... H01L 21/31111; H01L 21/3221; H01L 21/02592; H01L 21/02208; H01L 21/02211; H01L 21/02274; H01L 21/32136; H01L 21/0206; H01L 21/02115; H01L 21/32051
See application file for complete search history.

(56) References Cited

U.S. PATENT DOCUMENTS

| 4,466,380 | A  | * | 8/1984  | Jansen | ................. | C23C 16/503 |
|           |    |   |         |        |                   | 118/692     |
| 4,778,741 | A  | * | 10/1988 | Yasui  | ................. | G03G 5/08   |
|           |    |   |         |        |                   | 430/128     |
| 6,229,156 | B1 | * | 5/2001  | Murai  | ................. | H01L 29/41733 |
|           |    |   |         |        |                   | 257/57      |
| 6,331,494 | B1 | * | 12/2001 | Olson  | ................. | C23C 16/401 |
|           |    |   |         |        |                   | 257/E21.277 |

(Continued)

FOREIGN PATENT DOCUMENTS

JP   3036366   4/2000

*Primary Examiner* — Caridad Everhart
(74) *Attorney, Agent, or Firm* — Finnegan, Henderson, Farabow, Garrett & Dunner, L.L.P.

(57) ABSTRACT

A semiconductor manufacturing method in accordance with an embodiment includes feeding a first gas, which contains a component of a first film, to a reaction chamber, and forming a first film over a semiconductor substrate, which is accommodated in the reaction chamber, through plasma CVD. The semiconductor manufacturing method includes feeding a second gas to the reaction chamber after forming the first film, allowing the first gas in the reaction chamber to react on the second gas, and forming a second film, which has a composition different from that of the first film, over the surface of the first film. The semiconductor manufacturing method includes selectively removing the second film.

14 Claims, 6 Drawing Sheets

(56) References Cited

U.S. PATENT DOCUMENTS

| | | | |
|---|---|---|---|
| 6,712,077 B1* | 3/2004 | Hirano | H01L 21/02068 134/1.3 |
| 7,758,920 B2 | 7/2010 | Hasebe et al. | |
| 2002/0192984 A1 | 12/2002 | Hiyama et al. | |
| 2010/0044709 A1* | 2/2010 | Nakayama | H01L 29/66757 257/59 |
| 2012/0119278 A1* | 5/2012 | Mikasa | H01L 27/10823 257/306 |

* cited by examiner

SEMICONDUCTOR MANUFACTURING METHOD

CROSS-REFERENCE TO RELATED APPLICATIONS

This application is based upon and claims the benefit of priority from the prior Japanese Patent Application No. 2015-53832, filed on Mar. 17, 2015, the entire contents of which are incorporated herein by reference.

FIELD

An embodiment of the present invention relates to a semiconductor manufacturing method.

BACKGROUND

In a plasma chemical vapor deposition (CVD) process, a film is formed over a wafer by transforming a material gas, which is fed to a reaction chamber, into plasma through application of a high-frequency electric power. After the film formation is completed, feeding of the material gas is first suspended, and application of the high-frequency electric power is then suspended. This is intended to hinder generation of particles.

However, particles are generated because the material gas remaining in the reaction chamber brings about an abnormal reaction during a period of time from suspension of feeding of the material gas to suspension of application of the high-frequency electric power. The generated particles drop to the superficial surface of the wafer and contaminate the wafer. Since there is a fear that the particles may deteriorate the properties of devices, the particles have to be removed from the wafer.

As a method of removing particles from a wafer, lift-off based on wet etching or polishing based on chemical mechanical polishing (CMP) is generally adopted.

However, if particles having dropped to the superficial surface of a wafer adhere to the wafer, it is hard to remove the particles through wet etching. In the CMP process, even a formed film may be peeled off while the particles are being removed.

DETAILED DESCRIPTION

A semiconductor manufacturing method in accordance with an embodiment includes feeding a first gas, which contains a component of a first film, to a reaction chamber, and forming a first film over a semiconductor substrate, which is accommodated in the reaction chamber, through plasma CVD. The semiconductor manufacturing method includes feeding a second gas to the reaction chamber after forming the first film, allowing the first gas in the reaction chamber to react on the second gas, and thus forming a second film, which has a composition different from that of the first film, over the surface of the first film. Further, the semiconductor manufacturing method includes selectively removing the second film.

Embodiments will now be explained with reference to the accompanying drawings. The present invention is not limited to the embodiments.

Figure 1:
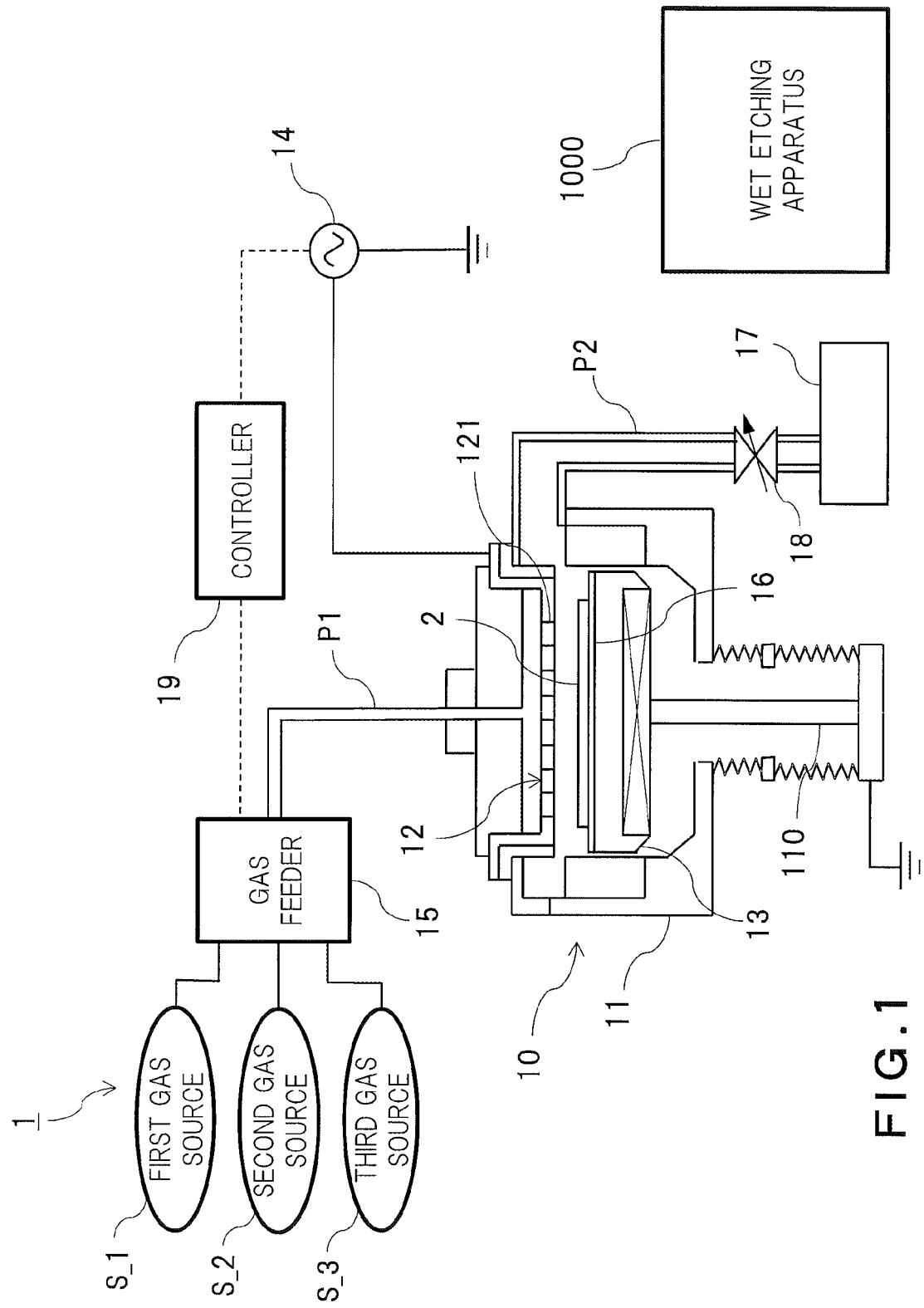
FIG. 1 is a diagram showing an example of a semiconductor manufacturing system 1 capable of being adapted to a semiconductor manufacturing method in accordance with an embodiment.

To begin with, a semiconductor manufacturing system 1 capable of being adapted to a semiconductor manufacturing method of an embodiment will be described below. FIG. 1 is a diagram showing an example of the semiconductor manufacturing system 1 to be adapted to the semiconductor manufacturing method of the embodiment.

The semiconductor manufacturing system 1 shown in FIG. 1 includes a film forming apparatus 10 and wet etching apparatus 1000.

The film forming apparatus 10 is a parallel plate CVD apparatus that forms a film through plasma CVD. As shown in FIG. 1, the film forming apparatus 1 includes a chamber 11, upper electrode 12, lower electrode 13, high-frequency power supply 14, gas feeder 15, heater 16, pump 17, valve 18, and controller 19.

The chamber 11 functions as a reaction chamber and accommodates a semiconductor substrate 2 (wafer).

The upper electrode 12 is disposed in the upper part of the interior of the chamber 11, while the lower electrode 13 is disposed in the lower part of the interior of the chamber 11 in parallel with the upper electrode 12. The lower electrode 13 also functions as a susceptor, and the semiconductor substrate 2 can be placed on the lower electrode 13. By raising or lowering the lower electrode 13 using a lift mechanism 110, the distance of the lower electrode 13 from the upper electrode 12 can be adjusted.

The upper electrode 12 is connected to the high-frequency power supply 14, and grounded. A high-frequency electric power is applied from the high-frequency power supply 14 to the upper electrode 12. When the high-frequency electric power is applied to the upper electrode 12, the upper electrode 12 is capacitively coupled to the lower electrode 13. Thus, electric power is fed to the chamber 11. With the electric power fed to the chamber 11, plasma to be described later is generated.

The upper electrode 12 also functions as a dispersion plate. More particularly, the upper electrode 12 uniformly disperses a gas, which is fed to the chamber 11 through a first pipe P1, within the surface of the upper electrode 12. The upper electrode 12 feeds (discharges) the dispersed gas to the lower electrode 13 (semiconductor substrate 2) by way of nozzles 121. The upper electrode 12 may be, for example, a shower-head electrode.

To the chamber 11, for example, a material gas containing a film component is fed. The material gas fed to the chamber 11 is transformed into plasma (ionized) due to electric power fed from the electrodes 12 and 13 in a vacuum. As a result, the chamber 11 is filled with the material gas made into plasma, and a film is deposited over the semiconductor substrate 2.

The gas feeder 15 is connected to first to third gas sources S_1 to S_3. The gas feeder 15 feeds gases of the gas sources S_1 to S_3 to the chamber 11 at a predetermined flow rate. The gas feeder 15 may include, for example, a mass flow controller or valve.

Now, the first gas source S_1 is a gas source of a first gas (raw gas) containing a component of a first film. The first gas is used to form the first film over the surface of the semiconductor substrate 2.

For example, the first film may be an amorphous silicon (a-Si) film. In this case, the first gas may be a silicon source gas. The silicon source gas may be a silane ($SiH_4$) gas. The first film may be an amorphous carbon film. In this case, the first gas may be a propylene ($C_3H_6$) gas or silane gas.

The second gas source S_2 is a gas source of a second gas. The second gas is used to remove particles that are derived from the first gas in the chamber 11 after the first film is formed. The second gas contains a component on which the first gas reacts. The second gas may be said to contain a component of a second film. The second gas is fed to the chamber 11 after the first film is formed, and allows the first gas in the chamber 11 to react on the second gas. The second gas allows the first gas to react on the second gas so as to form the second film over the surface of the first film. The second film is a film containing a composition different from that of the first film. The second film may be said to be a sacrificial film. Since the second film has a composition different from that of the first film, the second film can be selectively wet-etched. Since the second film can be selectively wet-etched, the second film can be removed from the semiconductor substrate 2 together with particles.

For example, if the first film is an amorphous silicon film, the second film may be a silicon nitride ($Si_3N_4$) film. In this case, the second gas may be an ammonia ($NH_3$) gas. If the first film is the amorphous silicon film, the second film may be a silicon dioxide ($SiO_2$) film. In this case, the second gas may be a carbon dioxide ($CO_2$) gas. If the first film is an amorphous carbon film, the second film may be a silicon dioxide film. In this case, the second gas may be a nitrous oxide ($N_2O$) gas.

The gas source S_3 is a gas source of a third gas. The third gas may be an inert gas (for example, helium gas) with which the first gas is diluted in order to facilitate generation of plasma. The type of third gas or the number of third gases is not limited to any specific one.

The heater 16 is included in the lower electrode 13. The heater 16 heats the semiconductor substrate 2 placed on the lower electrode 13. By heating the semiconductor substrate 2, a deposition rate for a film can be controlled. Based on the heated state of the semiconductor substrate 2, a film property such as an electric characteristic of a film or a thermal stress can be controlled.

The pump 17 is connected to the chamber 11 by way of a second pipe P2. The pump 17 deaerates the interior of the chamber 11, and thus brings the chamber 11 to a vacuum. The pump 17 may be, for example, a dry pump.

The valve 18 is disposed on the second pipe P2 linking the chamber 11 and pump 17. The valve 18 can be used to adjust the aperture of the second pipe P2, whereby the pressure inside the chamber 11 can be adjusted. The valve 18 may be, for example, a throttle valve.

The controller 19 electrically controls the operation of the semiconductor manufacturing apparatus 1. For example, the controller 19 controls the timing of feeding a gas from the gas feeder 15 or suspending the feeding, or the timing of applying a high-frequency electric power from the high-frequency power supply 14 or suspending the application.

The wet etching apparatus 1000 removes the second film using an etchant that exhibits high selectivity (high selection ratio) to the second film with respect to the first film. The wet etching apparatus 1000 may be of either a batch processing or single-wafer processing type.

For example, assuming that the first film is an amorphous silicon film and the second film is a silicon nitride film, the etchant may be an etchant containing a phosphoric acid ($H_3PO_4$). Using the etchant of a phosphoric acid series, the silicon nitride film can be removed without removal of the amorphous silicon film. Assuming that the first film is the amorphous silicon film and the second film is a silicon dioxide film, the etchant may be an etchant containing hydrofluoric acid (HF). Using the etchant of a hydrofluoric acid series, the silicon dioxide can be removed without removal of the amorphous silicon film. Assuming that the first film is an amorphous carbon film and the second film is the silicon dioxide film, the etchant may be an etchant containing hydrofluoric acid. Using the etchant of a hydrofluoric acid series, the silicon dioxide can be removed without removal of the amorphous carbon film.

Figure 2:
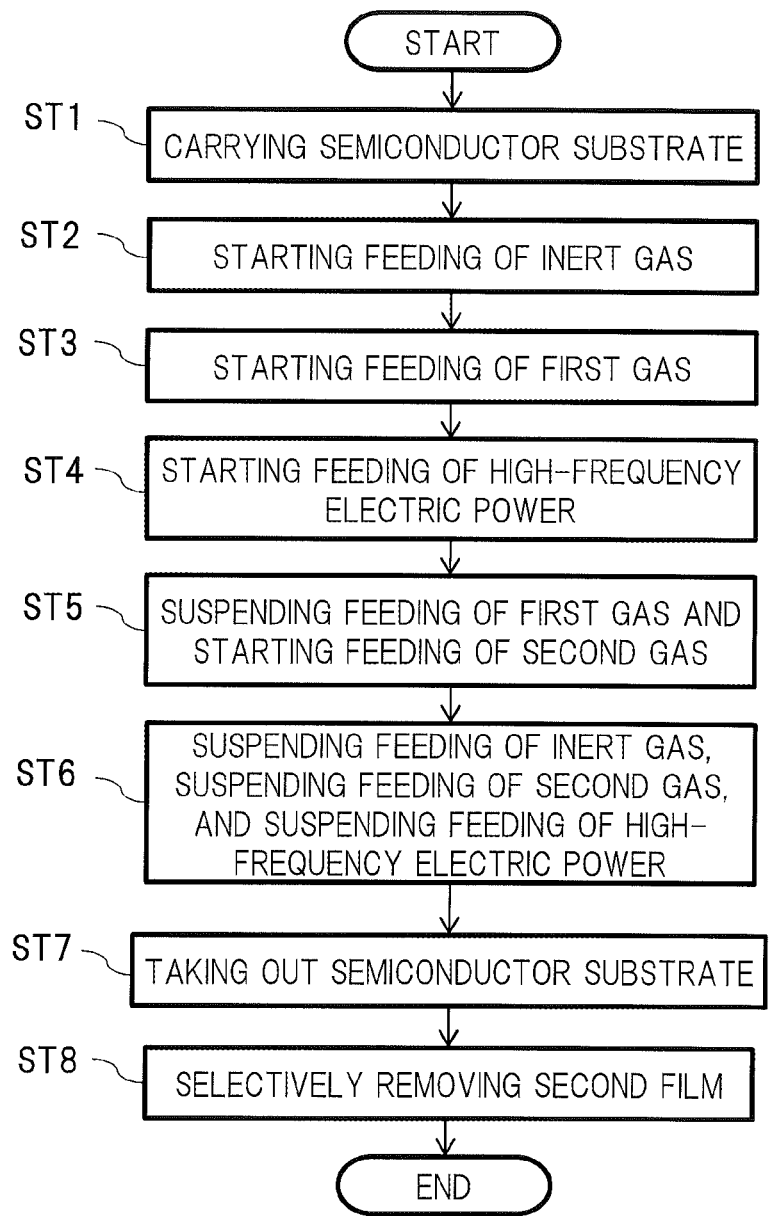
FIG. 2 is a flowchart describing the semiconductor manufacturing method of the embodiment.
Figure 3A:
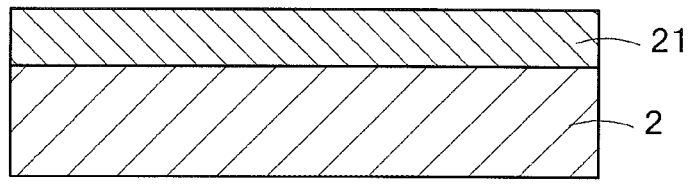
FIG. 3A is a diagram showing a first film 21 formed over a semiconductor substrate 2.
Figure 3B:
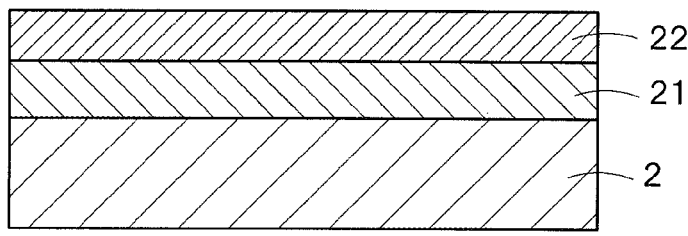
FIG. 3B is a diagram showing a second film 22 formed over the first film 21.
Figure 3C:
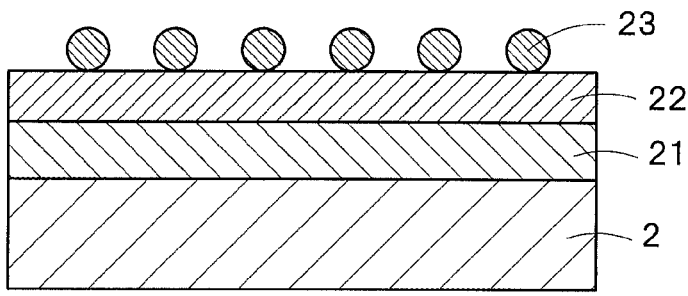
FIG. 3C is a diagram showing particles 23 adhering to the second film 22.
Figure 3D:
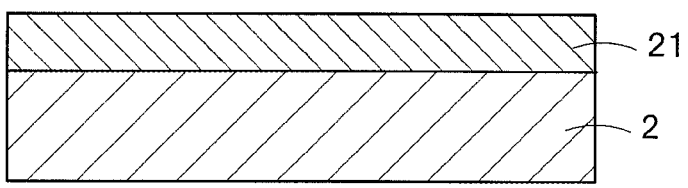
FIG. 3D is a diagram showing a state in which the second film 22 and particles 23 have been removed through wet etching.
Figure 4:
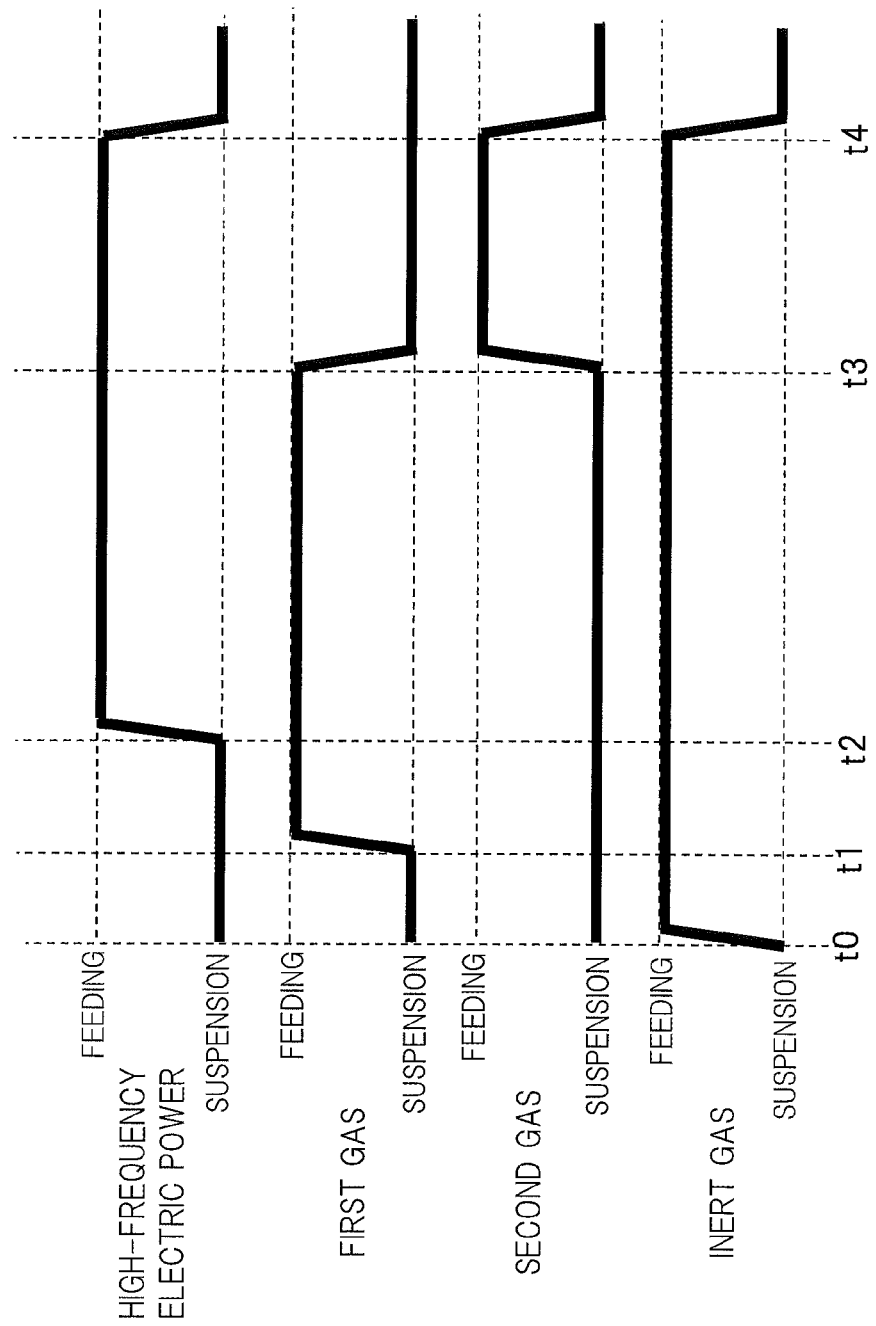
FIG. 4 is a timing chart concerning the semiconductor manufacturing method of the embodiment.

Next, referring to FIG. 2 to FIG. 4, an example of a semiconductor manufacturing method to which the semiconductor manufacturing system 1 having the foregoing configuration will be described below. FIG. 2 is a flowchart describing the semiconductor manufacturing method of the embodiment. FIGS. 3A to 3D are schematic diagrams of the semiconductor manufacturing method of the embodiment. More particularly, FIG. 3A is a diagram showing a first film 21 formed over a semiconductor substrate 2. FIG. 3B is a diagram showing a second film 22 formed over the first film 21. FIG. 3C is a diagram showing particles 23 adhering to the second film 22. FIG. 3D is a diagram showing a state in which the second film 22 and particles 23 have been removed through wet etching. FIG. 4 is a timing chart concerning the semiconductor manufacturing method of the embodiment.

To begin with, the semiconductor substrate 2 is carried into the chamber 11 (step S1 in FIG. 2). The semiconductor substrate 2 may be carried using a transport robot (for example, an automatic transport mechanism including a FOUP) that is not shown. The semiconductor substrate 2 carried into the chamber 11 is placed on the lower electrode 13 by means of, for example, lift pins.

Thereafter, the gas feeder 15 starts feeding of an inert gas to the chamber 11 at a time t=t0 shown in FIG. 4 (step S2 in FIG. 2). All actions of the gas feeder 15 including initiation of feeding of the inert gas may be controlled by the controller 19 (the same applies to the actions of any other unit to be described below).

Thereafter, the gas feeder 15 starts feeding of a first gas to the chamber 11 at a time t=t1 in FIG. 4 (step S3 in FIG. 2).

Thereafter, the high-frequency power supply 14 starts feeding (output) of a high-frequency electric power to the chamber 11 at a time t=t2 in FIG. 4 (step S4 in FIG. 2). All actions of the high-frequency power supply 14 including initiation of feeding of the high-frequency electric power may be controlled by the controller 19 (the same applies to the actions of any other unit to be described below). At this time, the chamber 11 is deaerated to a vacuum by the pump 17.

The first gas fed to the chamber 11 is diluted with the inert gas, and transformed into plasma due to feeding of a high-frequency electric power. A film formation seed generated during production of plasma is moved to the surface of the semiconductor substrate 2, whereby the first film 21 is, as shown in FIG. 3A, formed over the semiconductor substrate 2.

Thereafter, the gas feeder 15 suspends feeding of the first gas to the chamber 11 at a time t=t3 in FIG. 4 (step S5 in FIG. 2). At the same time, the gas feeder 15 starts feeding of a second gas to the chamber 11 (step S5 in FIG. 2).

The second gas fed to the chamber 11 allows the first gas in the chamber 11 to react on the second gas. The reaction is, for example, an oxidation reaction (that is, a reaction in which electrons are moved from the first gas into the second gas). The first gas having reacted on the second gas is, as shown in FIG. 3B, deposited as the second film 22 over the superficial surface of the first film 21.

At this time, feeding of the first gas to the chamber 11 is suspended, and deaeration by the pump 17 is continued. Therefore, the quantity of the first gas in plasma diminishes. In other words, in the plasma, the first gas is further diluted. The first gas is more readily transformed into plasma and brought to a film formation seed. Eventually, the first gas abnormally grows as particles 23.

However, in the present embodiment, the particles 23 are trapped in plasma. Since the particles 23 can be trapped in plasma, the particles 23 can be hindered from adhering to the surface of the first film 21 prior to formation of the second film 22.

Thereafter, the gas feeder 15 suspends feeding of the inert gas to the chamber 11 at a time t=t4 in FIG. 4 (step S6 in FIG. 2). At the same time, the gas feeder 15 suspends feeding of the second gas to the chamber 11 (step S6 in FIG. 2). Concurrently, the high-frequency power supply 14 suspends feeding of a high-frequency electric power to the chamber 11 (step S6 in FIG. 2).

Since feeding of a high-frequency electric power is suspended and plasma is terminated (extinguished), the particles 23 trapped in plasma drop to the semiconductor substrate 2. At this time, since the second film 22 is formed over the uppermost layer of the semiconductor substrate 2, the particles 23 adhere, as shown in FIG. 3C, to the surface of the second film 22. Therefore, the particles 23 can be prevented from adhering to the surface of the first film 21.

Thereafter, the semiconductor substrate 2 is taken out of the chamber 11 (step S7 in FIG. 2), and transported to the wet etching apparatus 1000. Transportation of the semiconductor substrate 2 to the wet etching apparatus 1000 may be achieved using a transport robot that is not shown.

Thereafter, the wet etching apparatus 1000 wet-etches the second film 22, which is formed over the semiconductor substrate 2, using an etchant that exhibits high selectivity to the second film 22 with respect to the first film 21 (step S8 in FIG. 2). Accordingly, as shown in FIG. 3D, the second film 22 can be removed together with the particles 23 from the semiconductor substrate 2, while the first film 21 can be retained on the semiconductor substrate 2.

According to the present embodiment, the second film 22 having a composition different from that of the first film 21 is formed over the surface of the first film 21, and the second film 22 is selectively removed. Thus, the unnecessary particles 23 alone can be removed without removal of the desired first film 21.

According to the embodiment, foreign matters over the semiconductor substrate 2 can be appropriately removed. As a result, a yield of semiconductor devices can be upgraded.

According to the present embodiment, when feeding of the first gas to the chamber 11 is suspended, the second gas can be fed to the chamber 11 at the same time. Therefore, adhesion of the particles 23 to the first film 21 and a phenomenon (gradation) that an interface between the first film 21 and second film 22 becomes unobvious can be suppressed in a well-balanced manner.

First Modification

Figure 5:
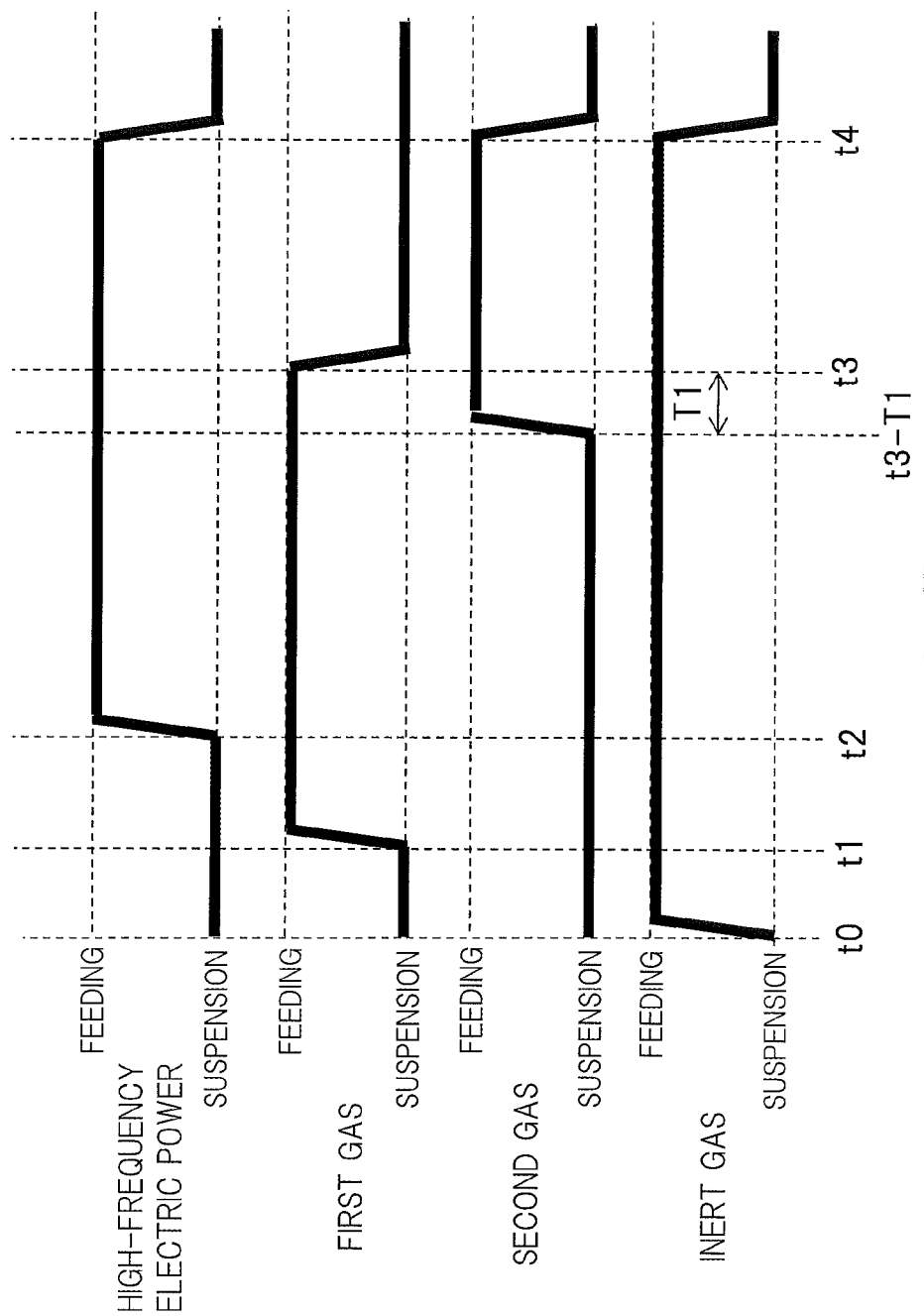
FIG. 5 is a timing chart concerning a semiconductor manufacturing method in accordance with a first modification of the embodiment.

Next, a first modification of the embodiment will be described below. A description of the modification will be confined to a difference from the semiconductor manufacturing method described in conjunction with FIG. 1 to FIG. 4. FIG. 5 is a timing chart concerning a semiconductor manufacturing method in accordance with the first modification of the embodiment.

In the semiconductor manufacturing method of the present modification, before feeding of a first gas to the chamber 11 is suspended, a second gas is fed to the chamber 11. More particularly, the gas feeder 15 starts feeding of the second gas to the chamber 11 at a time t=t3−T1 shown in FIG. 5. Specifically, the gas feeder 15 feeds the second gas to the chamber 11 at a second time t3−T1 that precedes a first time t3, at which feeding of the first gas to the chamber 11 is suspended, by a time T1 that falls within a predetermined time (≥T1). The predetermined time is not limited to any specific time. From viewpoint of hindering gradation, the predetermined time is desirably as short a time (for example, 1 sec) as possible.

According to the present modification, the timing of forming the second film 22 can be hastened. Therefore, adhesion of the particles 23 to the first film 21 can be reliably hindered.

Second Modification

Figure 6:
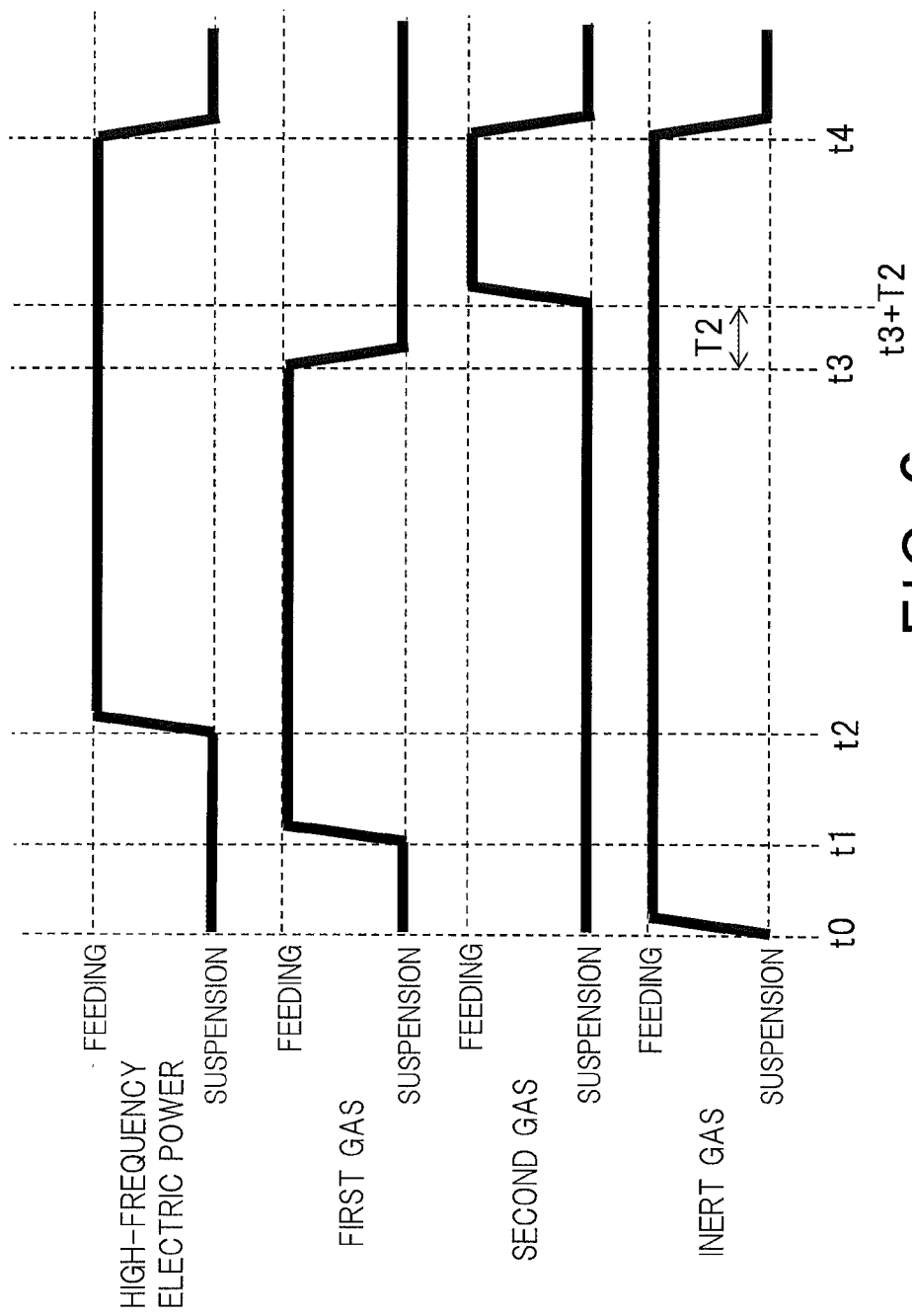
FIG. 6 is a timing chart concerning a semiconductor manufacturing method in accordance with a second modification of the embodiment.

Next, a second modification of the embodiment will be described below. A description of the present modification will be confined to a difference from the semiconductor manufacturing method described in conjunction with FIG. 1 to FIG. 4. FIG. 6 is a timing chart concerning a semiconductor manufacturing method in accordance with the second modification of the embodiment.

In the semiconductor manufacturing method of the present modification, after feeding of a first gas to the chamber 11 is suspended, a second gas is fed to the chamber 11. More particularly, the gas feeder 15 starts feeding of the second gas to the chamber 11 at a time t=t3+T2 shown in FIG. 6. Specifically, the gas feeder 15 feeds the second gas to the chamber 11 at a third time t3+T2 that succeeds a first time t3, at which feeding of the first gas to the chamber 11 is suspended, by an elapsed time T2 which falls within a predetermined time (≥T2). The predetermined time is not limited to any specific time. From viewpoint of hindering adhesion of the particles 23 to the first film 21, the predetermined time is desirably as short a time (for example, 1 sec) as possible.

According to the present modification, since the timing of forming the second film 22 can be retarded, occurrence of gradation can be effectively hindered. By hindering occurrence of gradation, the selectivity of the second film 22 to be exhibited by an etchant can be further upgraded.

The timing of suspending feeding of the first gas and the timing of suspending feeding of the second gas may be replaced with each other. The timing of suspending feeding of a high-frequency electric power may precede the timing of suspending feeding of a gas (first gas, second gas, or inert gas).

The embodiment may be adapted to removal of particles through dry etching. The embodiment may be adapted to removal of particles from the semiconductor substrate 2 containing germanium.

While certain embodiments have been described, these embodiments have been presented by way of example only, and are nor intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing method comprising:
feeding a first gas to a reaction chamber, the first gas comprises a component of a first film;
feeding a high-frequency electric power to the reaction chamber for forming a first film over a semiconductor substrate provided in the reaction chamber using plasma CVD method, the reaction chamber being deaerated;
feeding a second gas to the deaerated reaction chamber for forming a second film over the surface of the first film after forming the first film without suspending the feeding of the high-frequency electric power, allowing the first gas in the reaction chamber to react on the second gas, the second film comprises a composition different from that of the first film;
suspending the feeding of the high-frequency electric power for stopping the forming of the second film; and
selectively removing the second film.

2. The semiconductor manufacturing method according to claim 1, wherein when feeding of the first gas to the reaction chamber is suspended, feeding of the second gas to the reaction chamber is started at the same time.

3. The semiconductor manufacturing method according to claim 2, wherein the first gas is a silicon source gas and the first film comprises an amorphous silicon.

4. The semiconductor manufacturing method according to claim 1, wherein before feeding of the first gas to the reaction chamber is suspended, feeding of the second gas to the reaction chamber is started.

5. The semiconductor manufacturing method according to claim 4, wherein the first gas is a silicon source gas and the first film comprises an amorphous silicon.

6. The semiconductor manufacturing method according to claim 4, wherein feeding of the second gas to the reaction chamber is started at a second time that precedes a first time, at which feeding of the first gas to the reaction chamber is suspended, by a time which falls within a predetermined time.

7. The semiconductor manufacturing method according to claim 6, wherein the first gas is a silicon source gas and the first film comprises an amorphous silicon.

8. The semiconductor manufacturing method according to claim 1, wherein after feeding of the first gas to the reaction chamber is suspended, feeding of the second gas to the reaction chamber is started.

9. The semiconductor manufacturing method according to claim 8, wherein the first gas is a silicon source gas and the first film comprises an amorphous silicon.

10. The semiconductor manufacturing method according to claim 8, wherein feeding of the second gas to the reaction chamber is started at a third time that succeeds a first time, at which feeding of the first gas to the reaction chamber is suspended, by an elapsed time which falls within a predetermined time.

11. The semiconductor manufacturing method according to claim 10, wherein the first gas is a silicon source gas and the first film comprises an amorphous silicon.

12. The semiconductor manufacturing method according to claim 1, wherein the first gas is a silicon source gas and the first film comprises an amorphous silicon.

13. The semiconductor manufacturing method according to claim 12, wherein the first gas comprises silane, the second gas comprises ammonia, the second film comprises silicon nitride, and selective removal of the second film comprises wet etching using an etchant that comprises phosphoric acid.

14. The semiconductor manufacturing method according to claim 12, wherein the first gas comprises silane, the second gas comprises carbon dioxide, the second film comprises silicon dioxide, and selective removal of the second film comprises wet etching using an etchant that comprises hydrofluoric acid.

* * * * *